(12) United States Patent
Lee et al.

(10) Patent No.: US 9,583,639 B2
(45) Date of Patent: Feb. 28, 2017

(54) NONVOLATILE MEMORY DEVICE USING TWO-DIMENSIONAL MATERIAL AND METHOD OF MANUFACTURING THE SAME

(71) Applicant: Samsung Electronics Co., Ltd., Suwon-si, Gyeonggi-do (KR)

(72) Inventors: Jaeho Lee, Seoul (KR); Jinseong Heo, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/015,307

(22) Filed: Feb. 4, 2016

(65) Prior Publication Data

US 2016/0336439 A1    Nov. 17, 2016

(30) Foreign Application Priority Data

May 11, 2015    (KR) .................. 10-2015-0065554

(51) Int. Cl.
*H01L 29/788*    (2006.01)
*H01L 21/336*    (2006.01)
(Continued)

(52) U.S. Cl.
CPC .... *H01L 29/78696* (2013.01); *H01L 29/1606* (2013.01); *H01L 29/788* (2013.01)

(58) Field of Classification Search
CPC .................. H01L 29/78696; H01L 29/1606
(Continued)

(56) References Cited

U.S. PATENT DOCUMENTS 7,335,556 B2 * 2/2008 Yamaguchi ............ B82Y 10/00
                                                              438/257
8,698,481 B2    4/2014 Lieber et al.
(Continued)

FOREIGN PATENT DOCUMENTS

EP          2767505 A1    8/2014
KR      2009-0010758 A    1/2009
KR       20140010720 A    1/2014

OTHER PUBLICATIONS

Bertolazzi et al., Nonvolatile Memory Cells Based on MoS2/Graphene Heterostructures, Article, Mar. 19, 2013, pp. 3246-3252, No. 4, ACSNANO.
(Continued)

*Primary Examiner* — Calvin Lee
(74) *Attorney, Agent, or Firm* — Harness, Dickey & Pierce, P.L.C.

(57) ABSTRACT

Example embodiments relate to nonvolatile memory devices using a 2D material, and methods of manufacturing the nonvolatile memory device. The nonvolatile memory device includes a channel layer formed on a substrate, a gate stack that includes a gate electrode, source and drain electrodes. The channel layer has a threshold voltage greater than that of a graphene layer, and the gate stack includes a 2D material floating gate that is not in contact with the channel layer. The channel layer includes first and second material layers and a first barrier layer disposed between the first and second material layers, and the first and second material layers may contact the first barrier layer.

8 Claims, 6 Drawing Sheets

(51) Int. Cl.
*H01L 29/786* (2006.01)
*H01L 29/16* (2006.01)

(58) Field of Classification Search
USPC .......................... 438/263–266; 257/316–322
See application file for complete search history.

(56) References Cited

U.S. PATENT DOCUMENTS

| | | |
|---|---|---|
| 8,724,402 B2 | 5/2014 | Zhu |
| 2014/0014905 A1 | 1/2014 | Lee et al. |
| 2014/0131661 A1 | 5/2014 | Adkisson et al. |
| 2014/0231820 A1 | 8/2014 | Lee et al. |
| 2014/0233297 A1* | 8/2014 | Ozyilmaz .............. B82Y 10/00 365/145 |

OTHER PUBLICATIONS

Moon et al., Lateral Graphene Heterostructure Field-Effect Transitor, Magazine, Sep. 2013, pp. 1190-1192, vol. 34 No. 9, IEEE.

* cited by examiner

NONVOLATILE MEMORY DEVICE USING TWO-DIMENSIONAL MATERIAL AND METHOD OF MANUFACTURING THE SAME

CROSS-REFERENCE TO RELATED APPLICATION

This application claims the benefit of priority from Korean Patent Application No. 10-2015-0065554, filed on May 11, 2015, in the Korean Intellectual Property Office, the disclosure of which is incorporated herein in its entirety by reference.

BACKGROUND

1. Field

Example embodiments relate to memory devices, to nonvolatile memory devices using a two-dimensional (2D) material, and/or to methods of manufacturing the same

2. Description of the Related Art

A flash memory device is a type of nonvolatile memory device. An operational voltage for writing or erasing data on a flash memory device is, for example, approximately in a range from about 9V to about 12V. The operational voltage of a flash memory device is substantially high when compared to the operational voltage of other memory devices.

When an operational voltage of a flash memory device is lower than the above voltage range, the operational reliability of the flash memory device may be reduced.

Various methods of reducing the operational voltage of a nonvolatile memory device, such as a flash memory device, have been disclosed, and one of the methods includes using graphene. When graphene is used, the operational voltage of a nonvolatile memory device is expected to be lowered than the operational voltage of the related art. However, it may be difficult to maintain data stored in the nonvolatile memory device for a long time and an off-current may be increased as the size of the nonvolatile memory device may be reduced due to high integration.

SUMMARY

Example embodiments relate to nonvolatile memory devices that have a low operational voltage and a reduced off-current.

Additional example embodiments will be set forth in part in the description which follows and, in part, will be apparent from the description, or may be learned by practice of the example embodiments.

According to an example embodiment, a nonvolatile memory device includes a channel layer on a substrate, a gate stack including a gate electrode, a source electrode, and a drain electrode, wherein the channel layer has a threshold voltage that is greater than the threshold voltage of a graphene layer, the gate stack includes a floating gate formed of or including a 2D material (hereinafter, 2D material floating gate), and the 2D material floating gate does not contact the channel layer.

The channel layer may include a first material layer and a second material layer, and a barrier layer disposed between the first and second material layers, wherein the first and second material layers may contact the barrier layer.

The gate stack may further include a barrier layer and a gate insulating layer.

The first and second material layers respectively may include a 2D material.

The barrier layer may be a material layer different from the first and second material layers and include a 2D material.

The barrier layer may be a material layer that is different from the 2D material floating gate and that includes a 2D material.

The 2D material floating gate may include graphene, transition metal dichalcogenide (TMD), or molybdenite.

The 2D material may include graphene, TMD, or molybdenite.

BRIEF DESCRIPTION OF THE DRAWINGS

These and/or other example embodiments will become apparent and more readily appreciated from the following description taken in conjunction with the accompanying drawings in which.

DETAILED DESCRIPTION

Figure 1:
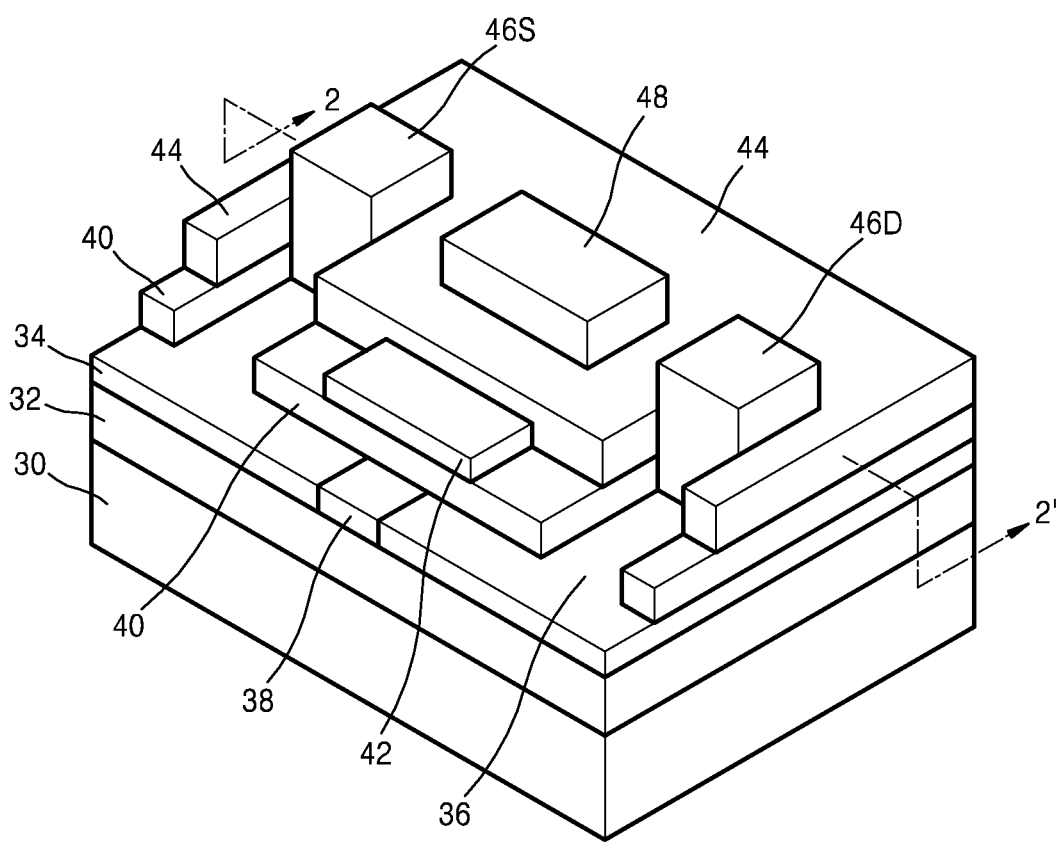
FIG. 1 is a perspective view of a nonvolatile memory device using a two-dimensional material according to an example embodiment.

A nonvolatile memory device (hereinafter, a memory device) using a two-dimensional (2D) material according to an example embodiment and a method of manufacturing the same will now be described with reference to the accompanying drawings. In the drawings, the thicknesses of layers and regions are exaggerated for clarity.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

FIG. 1 is a perspective view of a memory device using a two-dimensional material according to an example embodiment.

Referring to FIG. 1, an insulating layer 32 is formed on a substrate 30. The substrate 30 may be a silicon substrate or another substrate. The insulating layer 32 may be a dielectric layer, for example, a silicon oxide layer. The insulating layer 32 may be a material layer suitable for growing or transferring a two-dimensional material. The substrate 30 and the insulating layer 32 together may be referred to as a substrate. A two-dimensional material layer 34+36 is formed on the insulating layer 32. The two-dimensional material layer 34+36 includes a first material layer 34 and a second material layer 36. The first material layer 34 and the second material layer 36 may be the same two-dimensional material layers. The first material layer 34 and the second material layer 36 may be different material layers from each other. Each of the first material layer 34 and the second material layer 36 may be a single layer including a two dimensional material or multiple layers including a two dimensional material. The first material layer 34 and the second material layer 36 may be separated from each other. A first barrier layer 38 may be disposed on the insulating layer 32 between the first material layer 34 and the second material layer 36. A gap between the first material layer 34 and the second material layer 36 is filled with the first barrier layer 38. The first material layer 34 and the second material layer 36 contact the first barrier layer 38. The two-dimensional material may be, for example, graphene, transition metal dichalcogenide (TMD), or molybdenite. The first barrier layer 38 may be a dielectric layer having a thickness suitable for tunneling carriers (for example, electrons or holes) according to a voltage application condition. The first barrier layer 38 may include a two-dimensional material. When the two-dimensional material is graphene, the graphene may be formed by using a mechanical exfoliation transfer method, a growing method, or a chemical vapor deposition (CVD) method that uses a catalyst metal. A source electrode 46S is formed on the first material layer 34. The source electrode 46S may be formed on a region of the first material layer 34. The source electrode 46S may directly contact the first material layer 34. A drain electrode 46D is formed on the second material layer 36. The drain electrode 46D may directly contact the second material layer 36. The drain electrode 46D may be formed on a region of the second material layer 36. A second barrier layer 40 may be formed on the first material layer 34 and the second material layer 36. The second barrier layer 40 may cover the first barrier layer 38. The second barrier layer 40 may be an insulating layer having a thickness suitable for tunneling carriers (for example, electrons or holes) according to a voltage application condition. The second barrier layer 40 may include a two-dimensional material. The second barrier layer 40 may cover a whole upper surface of the first material layer 34 and the second material layer 36 and a whole upper surface of the first barrier layer 38 except regions on which the source electrode 46S and the drain electrode 46D are formed.

In FIG. 1, for convenience of explanation and as an example, it is depicted that the second barrier layer 40 is formed on a portion of the first material layer 34 and the second material layer 36 and a portion of the first barrier layer 38.

According to at least one example embodiment, a floating gate 42 is formed on the second barrier layer 40. The floating gate 42 may be a two-dimensional material layer such as, for example, a graphene floating gate formed of or including graphene. The floating gate 42 may perform as the same function as a floating gate of a general flash memory device. The floating gate 42 is disposed between the source electrode 46S and the drain electrode 46D. The floating gate 42 is disposed on a location covering portions of the first barrier layer 38, the first material layer 34, and the second material layer 36. A gate insulating layer 44 is formed on the floating gate 42. The gate insulating layer 44 may cover a whole upper surface of the floating gate 42. The gate insulating layer 44 may expand on the second barrier layer 40. The gate insulating layer 44 may cover a whole upper surface of the second barrier layer 40 around the floating gate 42. The gate insulating layer 44 may cover a whole supper surface of the second barrier layer 40 around the source electrode 46S and the drain electrode 46D. A gate electrode 48 is formed on the gate insulating layer 44 between the source electrode 46S and the drain electrode 46D. The gate electrode 48 may be disposed directly above the floating gate 42. The gate electrode 48 may be disposed so that a bottom surface of the gate electrode 48 faces an upper surface of the floating gate 42.

Figure 2:
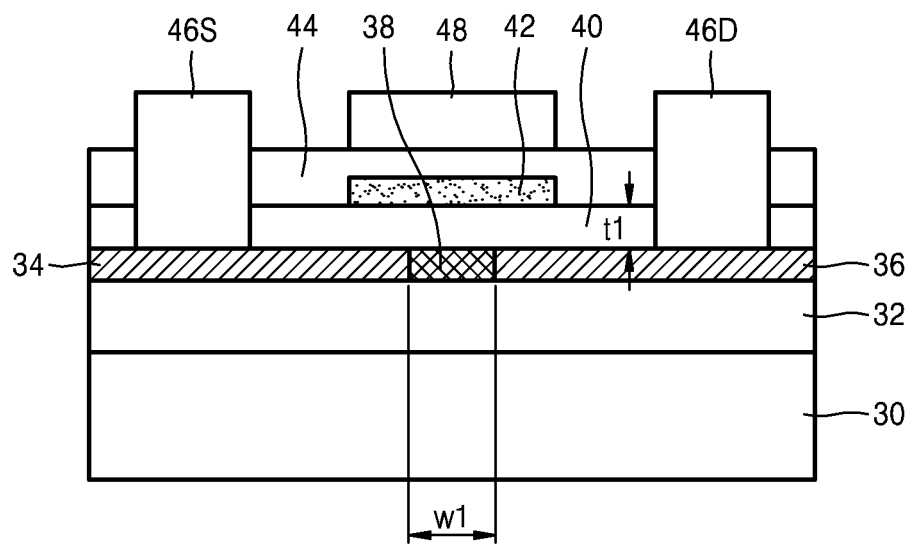
FIG. 2 is a cross-sectional view taken along line 2-2' of FIG. 1.

FIG. 2 is a cross-sectional view taken along line 2-2' of FIG. 1.

Referring to FIG. 2, the first material layer 34 and the second material layer 36 are channel layers. Work functions of the first material layer 34 and the second material layer 36 may be controlled according to a condition of voltage that is applied to the gate electrode 48. Accordingly, a current flowing through the first barrier layer 38 disposed between the first material layer 34 and the second material layer 36 may be controlled. As a result, since the first barrier layer 38 is disposed between the first material layer 34 and the second material layer 36, there is a threshold voltage at which a current begins to flow between the source electrode 46S and the drain electrode 46D. The threshold voltage may vary according to a width W1 of the first barrier layer 38. The fact that a threshold voltage is present between the source electrode 46S and the drain electrode 46D, and that the threshold voltage is controllable denotes that an off-current or a stand-by current of a memory device is controllable.

When a writing voltage (a program voltage) is applied to the gate electrode 48, a carrier is stored in the floating gate 42 after tunneling through the second barrier layer 40 from the channel layer (for example, a graphene channel layer). Since the carrier is stored in the floating gate 42, that is, data is written in a memory device, the threshold voltage of the memory device is changed. Through measuring the threshold voltage change in the memory device, the storage of the data in the memory device may be checked. When the carrier stored in the floating gate 42 is removed, that is, when the data stored in the memory device is erased, a voltage is applied to the gate electrode 48 in a direction opposite to the direction of application of the voltage when the data is stored. Accordingly, the carrier stored in the floating gate 42 may be discharged to the channel layer through the second barrier layer 40. Accordingly, an operational voltage of the memory device may be related to the thickness t1 of the second barrier layer 40. The second barrier layer 40 may have a thickness in a range configured to maintain the operational voltage of the memory device lower than the operational voltage of an existing memory device. Also, the second barrier layer 40 may have a thickness in a range configured to minimize the natural volatility of the stored data in the memory device.

Figure 3:
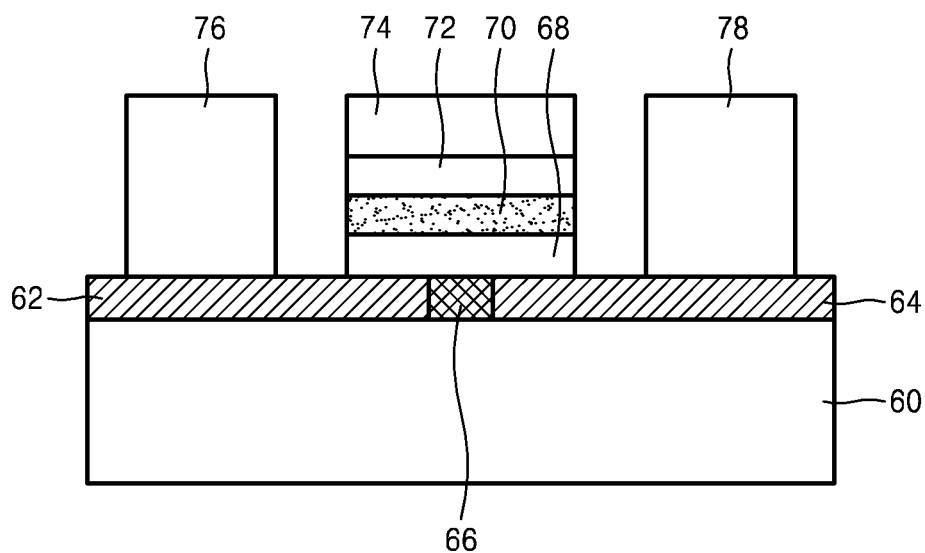
FIG. 3 is a cross-sectional view of a nonvolatile memory device using a two-dimensional material according to another example embodiment.

FIG. 3 is a cross-sectional view of a nonvolatile memory device using a two-dimensional material according to another example embodiment.

Referring to FIG. 3, a first channel layer 62 and a second channel layer 64 are formed on a substrate 60. The first and second channel layers 62 and 64 are separated from each other. A dielectric layer 66 is disposed between the first and second channel layers 62 and 64. The dielectric layer 66 may be configured to function as a barrier. The first and second channel layers 62 and 64 contact the dielectric layer 66. The material and function of the first and second channel layers 62 and 64 may be the same as the material and function of the first material layer 34 and the second material layer 36. The substrate 60 may include a material layer that is suitable for growing or depositing a two-dimensional material. The material and function of the dielectric layer 66 may also be the same as the material and function of the first barrier layer 38 of FIG. 2. A first insulating layer 68 is formed between the first and second channel layers 62 and 64. The first insulating layer 68 may be a tunneling layer. The first insulating layer 68 covers the dielectric layer 66. The material and function of the first insulating layer 68 may be the same as the material and function of the second barrier layer 40 of FIG. 2. A floating gate 70, a second insulating layer 72, and a gate electrode 74 may be sequentially stacked on the first insulating layer 68. The second insulating layer 72 may be a gate insulating layer. The first insulating layer 68, the floating gate 70, the second insulating layer 72, and the gate electrode 74 altogether may be referred to as a gate stack. A source electrode 76 is formed on the first channel layer 62. The source electrode 76 is separated from the gate stack. A drain electrode 78 is formed on the second channel layer 64. The drain electrode 78 is separated from the gate stack. An interlayer insulating layer may be filled between the gate stack and the source and drain electrodes 76 and 78.

Figure 4:
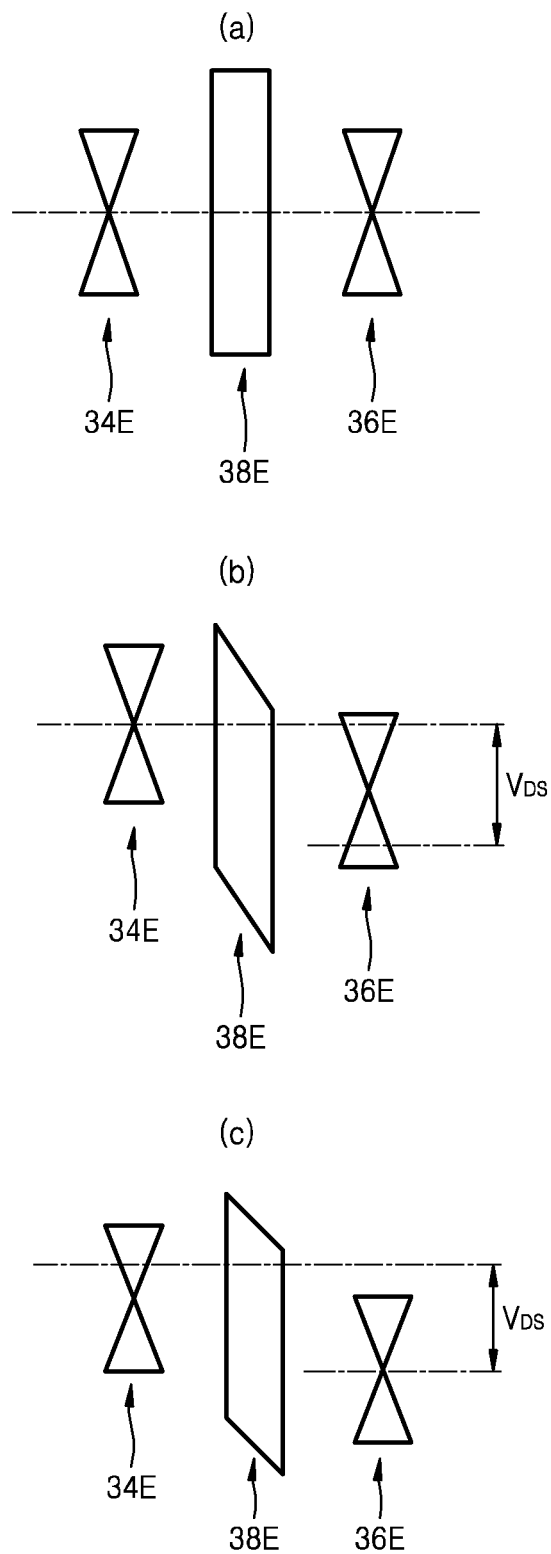
FIG. 4 illustrates the change of energy levels of elements included in a channel layer when a floating gate is not included in a nonvolatile memory device using a two-dimensional material according to an example embodiment.

FIG. 4 illustrates the change of energy levels of the first material layer 34, the first barrier layer 38, and the second material layer 36 when the floating gate 42 is not included in a nonvolatile memory device using a two-dimensional material according to an example embodiment. In FIG. 4, the first and second material layers 34 and 36 may be, as an example, graphene layers.

FIG. 4(a) illustrates the change of energy level when a potential difference between the source electrode 46S and the drain electrode 46D is substantially equal to 0 and the potential difference between the gate electrode 48 and the source electrode 46S is substantially equal to 0. FIG. 4(b) illustrates the change of energy level when a potential difference between the source electrode 46S and the drain electrode 46D is greater than 0 (VDS>0) and the potential difference between the gate electrode 48 and the source electrode 46S is substantially equal to 0 (VGS=0). FIG. 4(c) illustrates the change of energy level when a potential difference between the source electrode 46S and the drain electrode 46D is greater than 0 (VDS>0) and the potential difference between the gate electrode 48 and the source electrode 46S is greater than 0 (VGS>0). In FIG. 4, reference numerals 34E, 36E, and 38E respectively indicate the energy level of the first material layer 34, the second material layer 36, and the first barrier layer 38.

Referring to (a), (b), and (c) of FIG. 4, a current flows from the first material layer 34 to the second material layer 36 tunneling through the first barrier layer 38 when the potential difference between the source electrode 46S and the drain electrode 46D is greater than 0 (VDS>0) and the potential difference between the gate electrode 48 and the source electrode 46S is greater than 0 (VGS>0). Accordingly, the operation of the memory device is similar to the operation of a general graphene transistor when the floating gate 42 is not included in the memory device.

Figure 5:
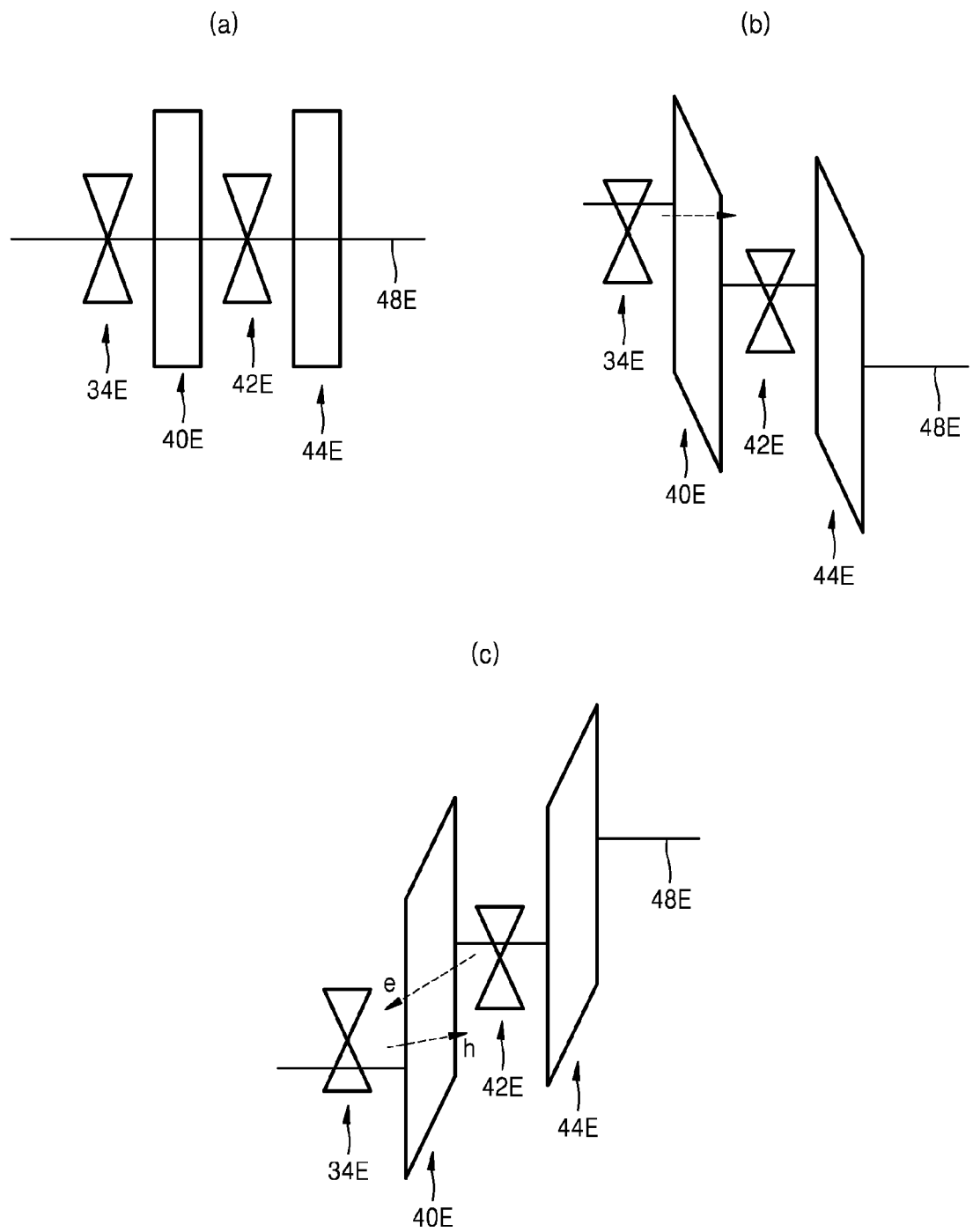
FIG. 5 illustrates the change of energy levels of a channel layer-gate electrode according to an operational voltage of a nonvolatile memory device using a two-dimensional material according to an example embodiment.

FIG. 5 illustrates the change of energy levels related to the operation of a memory device using a two-dimensional material according to an example embodiment. In FIG. 5, reference numerals 34E, 40E, 42E, 44E, and 48E respectively indicate the energy level of the first material layer 34, of the second barrier layer 40, of the floating gate 42, of the gate insulating layer 44, and of the gate electrode 48. In FIG. 5, a material for forming the first material layer 34 and the floating gate 42 may be, as an example, graphene.

In FIG. 5, FIG. 5(a) illustrates the change of energy level when the memory device is in an initial state, that is, in a state when data is not written in the memory device (an operational voltage is not applied). FIG. 5(b) illustrates the change of energy level when a voltage greater than 0 (VD>0) is applied to the drain electrode 46D and when a writing voltage (a program voltage) (VG=Vpgm) for writing data (for example, '1') is applied to the gate electrode 48. FIG. 5(c) illustrates the change of energy level when an erasing operation (when writing data "0") with respect to the memory device is performed, for example, the change of energy level when a voltage of VD=0V is applied to the drain electrode 46D and an erasing voltage (VG<0) is applied to the gate electrode 48 of the memory device.

Referring to FIG. 5(b), due to the operational voltage applied to the drain electrode 46D and the gate electrode 48, the energy levels of each of the layers are changed from their respective initial states. For example, due to the application of the operational voltage, a thin region is generated in the energy level 40E of the second barrier layer 40. This denotes that carriers (for example, an electron) are able to tunnel through the second barrier layer 40. Also, the energy level 34E of the first material layer 34 is changed, and thus, electrons are present in a conduction band. Also, the energy level 34E of the first material layer 34 is relatively higher than the energy level 42E of the floating gate 42. Accordingly, the electrons 'e' are stored in the floating gate 42 after tunneling through the second barrier layer 40 from the first material layer 34. In this manner, data "1" is recorded in the memory device.

Referring to FIG. 5(c), due to the erasing voltage applied to the memory device, the relationship of the energy levels of the layers is opposite to the embodiment illustrated on FIG. 5(b). For example, the energy level 42E of the floating gate 42 is relatively higher than the energy level 34E of the graphene channel layer (the first material layer 34), and a thin region in thickness with respect to the energy level 42E of the floating gate 42 appears in the energy level 40E of the second barrier layer 40. Accordingly, electrons stored in the floating gate 42 may be discharged to the graphene channel layer tunneling through the second barrier layer 40. Holes may be moved from the graphene channel layer to the floating gate 42 tunneling through the second barrier layer 40.

A method of manufacturing a memory device according to an example embodiment will be described. Like reference numerals are used to indicate identical elements as described above.

Figure 6:
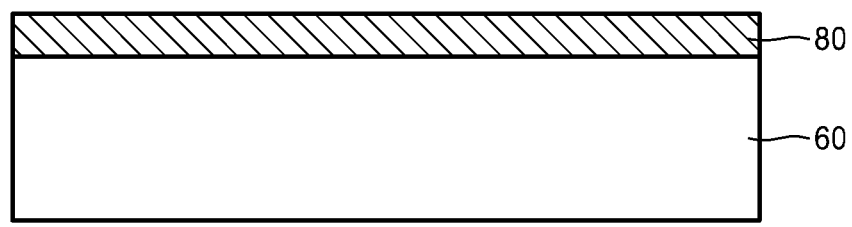
FIGS. 6 through 8 are cross-sectional views illustrating a method of manufacturing a nonvolatile memory device according to an example embodiment.
Figure 7:
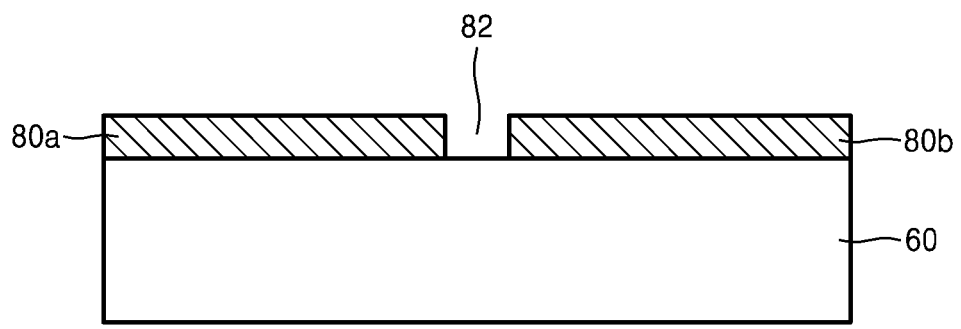

Referring to FIG. 6, a two-dimensional (2D) material layer 80 is formed on a substrate 60. The 2D material layer 80 may be formed by using, for example, a growing method or a transferring method. The 2D material layer 80 may be a graphene layer or a transitional metal dichalcogenide (TMD) material layer. When the 2D material layer 80 is a graphene layer, the 2D material layer 80 may be formed by transferring a graphene layer on the substrate 60 after separately forming the graphene layer. The substrate 60 may include a plurality of material layers. The uppermost layer of the material layers may be a material layer suitable for forming the 2D material layer 80. As depicted in FIG. 7, after forming the 2D material layer 80, a portion of the 2D material layer 80 may be removed. As a result, a slit 82 through which the substrate 60 is exposed is formed in the 2D material layer 80. The slit 82 may have a width which is the same as the width W1 of the first barrier layer 38 of FIG. 2. Due to the slit 82, the 2D material layer 80 is divided into a first 2D material layer 80a and a second 2D material layer 80b. The first and second 2D material layers 80a and 80b may correspond to the first channel layer 62 and the second channel layer 64 of FIG. 3.

Figure 8:
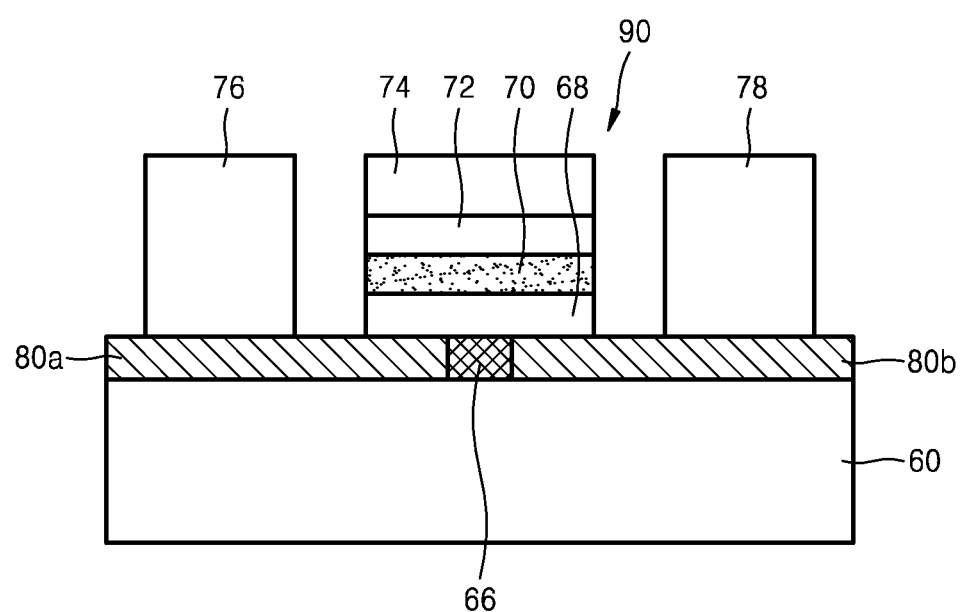

Referring to FIG. 8, the slit 82 may be filled with the dielectric layer 66. The dielectric layer 66 directly contacts the first and second 2D material layers 80a and 80b.

A gate stack 90 that covers the dielectric layer 66 is formed on the first and second 2D material layers 80a and 80b. The source electrode 76 and the drain electrode 78 are respectively formed on the first 2D material layer 80a and the second 2D material layer 80b. The source and drain electrodes 76 and 78 may be formed before or after forming the gate stack 90. When the gate stack 90 is formed before forming the source and drain electrodes 76 and 78, after sequentially forming a first insulating layer 68, a floating gate 70, a second insulating layer 72, and a gate electrode 74, the gate stack 90 may be formed by patterning the stack of the first insulating layer 68, the floating gate 70, the second insulating layer 72, and the gate electrode 74. When the source and drain electrodes 76 and 78 are formed, after covering the gate stack 90 with a protection material (for example, a photoresist), a metal layer for forming the source and drain electrodes 76 and 78 is formed. Afterwards, the source and drain electrodes 76 and 78 are formed by patterning the metal layer.

The nonvolatile memory devices according to the example embodiments include a graphene channel and a graphene floating gate. Accordingly, an operational voltage of the nonvolatile memory devices may be lowered. Also, a barrier layer is disposed between a floating gate and a channel, and thus, the natural volatility of stored data may be minimized. In addition, the channel includes a slit, and the slit is filled with a barrier layer. Accordingly, a threshold voltage that is controlled according to a voltage applied to a gate electrode is present in the channel, and thus, an off-current (a stand-by current) of the memory device may be reduced. As a result, the operational voltage of the memory device may be lowered, and operational reliability of the memory device may be ensured. The memory device described above uses a 2D material, and thus, the memory device may be applied to a device that requires a flexible characteristic and/or stretching ability.

While one or more example embodiments have been described with reference to the figures, it will be understood by those of ordinary skill in the art that various changes in form and details may be made therein without departing from the spirit and scope as defined by the following claims.

What is claimed is:

1. A nonvolatile memory device comprising:
    a substrate;
    a channel layer on the substrate;
    a gate stack on the channel layer, the gate stack including a gate electrode;
    a source electrode on the channel layer; and
    a drain electrode on the channel layer,
    wherein the channel layer has a threshold voltage that is greater than a threshold voltage of a graphene layer, and
    the gate stack includes a 2D material floating gate, and the 2D material floating gate does not contact the channel layer.

2. The nonvolatile memory device of claim 1, wherein the gate stack further comprises:
    a barrier layer; and
    a gate insulating layer.

3. The nonvolatile memory device of claim 2, wherein the barrier layer includes a 2D material that is different from the 2D material floating gate.

4. The nonvolatile memory device of claim 2, wherein the 2D material floating gate comprises graphene, transition metal dichalcogenide (TMD), or molybdenite.

5. The nonvolatile memory device of claim 1, wherein the channel layer comprises:
    a first material layer;
    a second material layer; and
    a barrier layer between the first and second material layers,
    wherein the first and second material layers are in contact with the barrier layer.

6. The nonvolatile memory device of claim 2, wherein the barrier layer includes a 2D material that is different from a material of the first and second material layers.

7. The nonvolatile memory device of claim 2, wherein the first and second material layers respectively comprise a 2D material.

8. The nonvolatile memory device of claim 7, wherein the 2D material comprises graphene, TMD, or molybdenite.

* * * * *